(12) United States Patent
Monangi et al.

(10) Patent No.: US 10,348,319 B1
(45) Date of Patent: Jul. 9, 2019

(54) RESERVOIR CAPACITOR BASED ANALOG-TO-DIGITAL CONVERTER

(71) Applicant: Analog Devices Global Unlimited Company, Hamilton (BM)

(72) Inventors: Sandeep Monangi, Srikakulam (IN); Anoop Manissery Kalathil, Kuttippuram (IN); Vinayak Mukund Kulkarni, Bangalore (IN); Michael C. W. Coln, Lexington, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/983,658

(22) Filed: May 18, 2018

(51) Int. Cl.
*H03M 1/06* (2006.01)
*H03M 1/08* (2006.01)

(52) U.S. Cl.
CPC ........... *H03M 1/0607* (2013.01); *H03M 1/08* (2013.01)

(58) Field of Classification Search
CPC ........ H03M 1/0607; H03M 1/08; H03M 1/00; H03M 1/12; H03M 1/0646; H03M 1/785; H03M 1/06; H03M 1/1023
USPC .......................................... 341/155, 118, 161
See application file for complete search history.

(56) References Cited

U.S. PATENT DOCUMENTS

| | | | |
|---|---|---|---|
| 7,432,844 B2 | 10/2008 | Mueck et al. | |
| 7,961,131 B2 | 6/2011 | Craninckx | |
| 8,390,502 B2 | 3/2013 | Kapusta | |
| 8,441,386 B2 | 5/2013 | Strode | |
| 8,537,045 B2 | 9/2013 | Kapusta | |
| 8,552,897 B1 * | 10/2013 | Hurrell | H03F 3/45 341/136 |
| 8,754,794 B1 | 6/2014 | Li et al. | |
| 9,503,055 B2 * | 11/2016 | Meehan | H03K 17/161 |
| 9,608,655 B1 | 3/2017 | Li | |
| 9,712,181 B1 | 7/2017 | Chen et al. | |
| 9,806,734 B1 | 10/2017 | Madan et al. | |
| 10,122,376 B2 | 11/2018 | Kalathil et al. | |
| 2008/0129573 A1 | 6/2008 | Mueck et al. | |
| 2009/0273501 A1 | 11/2009 | Madhavan et al. | |
| 2013/0249727 A1 | 9/2013 | Hurrell | |
| 2015/0091744 A1 | 4/2015 | Shen et al. | |
| 2015/0318841 A1 * | 11/2015 | Meehan | H03K 17/161 327/554 |

(Continued)

OTHER PUBLICATIONS

"U.S. Appl. No. 15/711,176, Notice of Allowance dated Aug. 24, 2018", 5 pgs.

(Continued)

*Primary Examiner* — Jean B Jeanglaude
(74) *Attorney, Agent, or Firm* — Schwegman Lundberg & Woessner, P.A.

(57) ABSTRACT

Techniques to use reservoir capacitors in ADC to supply most of the charge to bit-trial capacitors as bit-trials are performed. An accurate reference voltage source, e.g., a reference buffer circuit, only needs to supply the difference, e.g., an inaccuracy, in the charge supplied by the reservoir capacitors. Instead of having to resettle for each bit-trial, the accurate reference voltage source has only to deliver the initial charge to the reservoir capacitors during acquisition and once more when the ADC is ready to sample onto the residue amplifier. These techniques can ease the demands on the reference buffer circuit and requirement of external decoupling capacitors, for example.

24 Claims, 14 Drawing Sheets

(56) References Cited

U.S. PATENT DOCUMENTS

2016/0182078 A1* 6/2016 Shen ................. H03M 1/08
  341/122
2018/0019761 A1   1/2018 Coln
2018/0131384 A1   5/2018 Kalathil et al.

OTHER PUBLICATIONS

"U.S. Appl. No. 15/711,176, Notice of Allowance dated Jun. 25, 2018", 6 pgs.
"U.S. Appl. No. 15/711,176, Notice of Allowance dated Mar. 20, 2018", 10 pgs.
"U.S. Appl. No. 15/711,176, Preliminary Amendment filed Apr. 25, 2018", 12 pgs.
"U.S. Appl. No. 15/711,176, Preliminary Amendment filed Oct. 17, 2017", 10 pgs.

* cited by examiner

US 10,348,319 B1

RESERVOIR CAPACITOR BASED ANALOG-TO-DIGITAL CONVERTER

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

Using various techniques of this disclosure, a capacitor array of a digital-to-analog converter (DAC) circuit of a first stage of a pipelined ADC circuit or a SAR ADC circuit can include bit-trial capacitors and corresponding respective reservoir capacitors. During a conversion phase, a control circuit can control transfer of a charge from a reservoir capacitor to set one of the bit-trial capacitors based on a comparator decision. Then, the control circuit can couple a reference voltage to the previously set bit-trial capacitor to transfer another charge, e.g., prior to generating a residue voltage in a pipelined ADC circuit, where the reference voltage is more accurate than the voltage of the reservoir capacitor.

By using the techniques of this disclosure, the reservoir capacitors can supply most of the charge to the bit-trial capacitors as the bit-trials are performed. The accurate reference voltage source, e.g., an "external" reference buffer circuit, only needs to supply the difference, e.g., an inaccuracy, in the charge supplied by the reservoir capacitors. Instead of having to resettle for each bit-trial, the accurate reference voltage source has only to deliver the initial charge to the reservoir capacitors during acquisition and once more when the ADC circuit is ready to sample onto the residue amplifier.

In some aspects, this disclosure is directed to a method for operating a pipelined analog-to-digital (ADC) circuit. The method comprises coupling an analog input signal onto a capacitor array of a first ADC circuit of a first stage of the pipelined ADC circuit, the capacitor array including bit-trial capacitors and corresponding respective reservoir capacitors; transferring a first charge from a reservoir capacitor to set a bit-trial capacitor of the capacitor array; and before generating a residue voltage using the first ADC circuit, coupling a reference voltage to the previously set bit-trial capacitor to transfer a second charge.

In some aspects, this disclosure is directed to a pipelined analog-to-digital converter (ADC) circuit comprising a first ADC circuit of a first stage of the pipelined. ADC circuit, the first ADC circuit including a digital-to-analog converter (DAC) circuit having a capacitor array including bit-trial capacitors and corresponding respective reservoir capacitors; a control circuit configured to control operation of a plurality of switches to: couple an analog input signal onto the capacitor array; transfer a first charge from a reservoir capacitor to set a bit-trial capacitor of the capacitor array; and before generating a residue voltage using the first ADC circuit, couple a reference voltage to the previously set bit-trial capacitor to transfer a second charge.

In some aspects, this disclosure is directed to a method for operating a successive approximation register (SAR) analog-to-digital (ADC) circuit. The method comprises coupling an analog input signal onto a capacitor array of a first ADC circuit of the SAR ADC circuit, the capacitor array including bit-trial capacitors and corresponding respective reservoir capacitors; performing a SAR bit-trial including: transferring a first charge from a reservoir capacitor to set a bit-trial capacitor of the capacitor array; and coupling a reference voltage to the previously set bit-trial capacitor to transfer a second charge.

In some aspects, this disclosure is directed to a successive approximation register (SAR) analog-to-digital converter (ADC) circuit comprising a first ADC circuit of the SAR ADC circuit, the first ADC circuit including a digital-to-analog converter (DAC) circuit having a capacitor array including bit-trial capacitors and corresponding respective reservoir capacitors; a control circuit configured to control operation of a plurality of switches to: couple an analog input signal onto the capacitor array; perform a SAR bit-trial including: transfer a first charge from a reservoir capacitor to set a bit-trial capacitor of the capacitor array; and couple a reference voltage to the previously set bit-trial capacitor to transfer a second charge.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
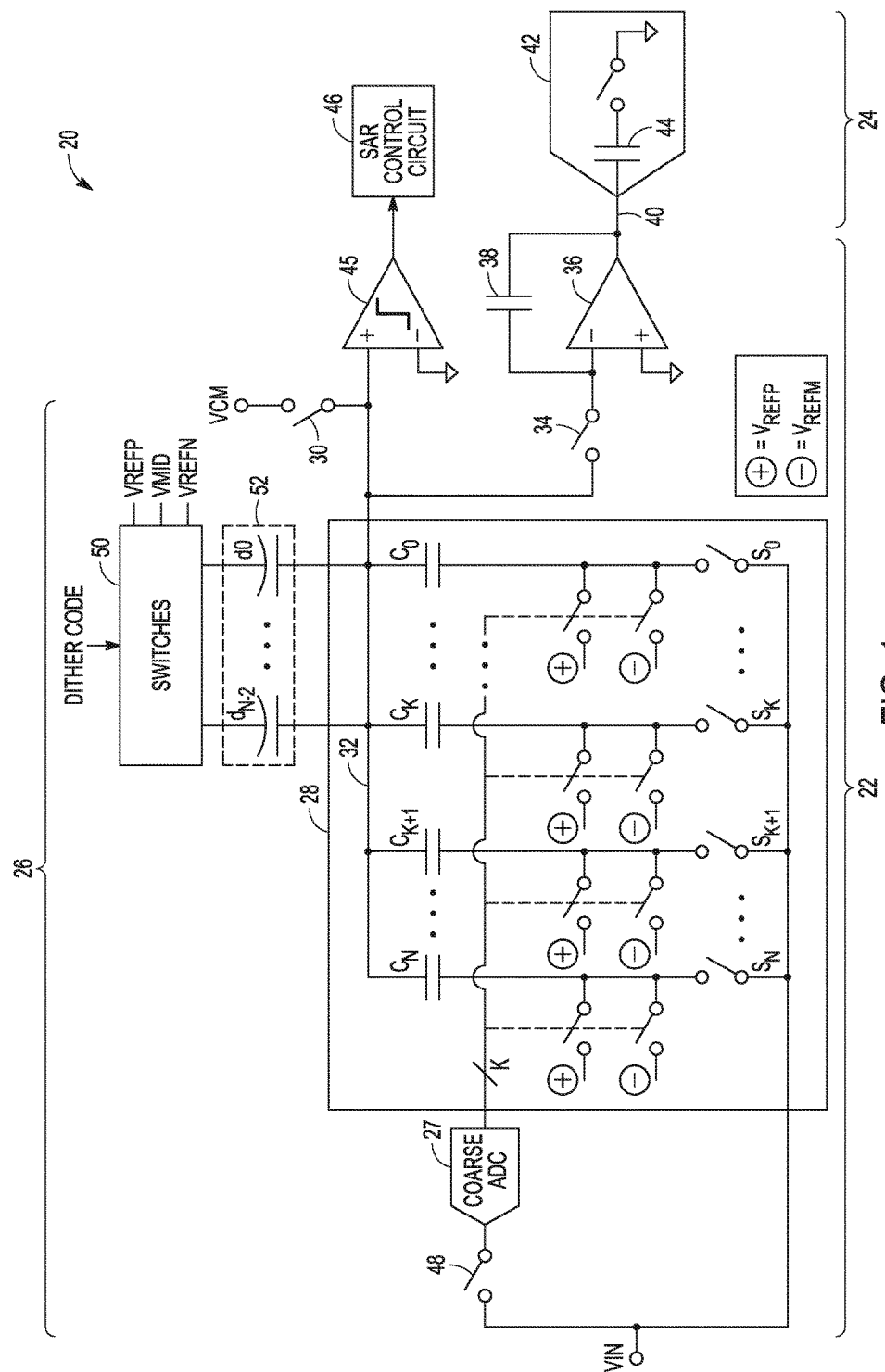
FIG. 1 is a simplified schematic diagram of an example of a pipelined ADC circuit.

Various analog-to-digital converter (ADC) topologies exist, including delta-sigma, successive approximation register (SAR), flash, and pipelined converters. In a pipelined ADC topology, the circuit is divided into two or more stages, where each stage includes an ADC responsible for processing a portion of the result.

Some analog-to-digital converter (ADC) approaches utilize an internal reference buffer circuit. To improve overall ADC accuracy for such ADC circuits, the reference buffer output should settle in every bit-trial. In addition, there can be high power consumption for a given throughput for such ADC circuits. External decoupling capacitors, however, can be used to supply current during fast bit trials.

In addition to utilizing an internal reference buffer circuit, some ADC approaches further utilize reservoir capacitors, which can eliminate the external decoupling capacitors. For reservoir capacitor based ADC circuits, the internal reference buffer can be utilized during the acquisition phase. As such, the reference buffer power consumption for reservoir capacitor based ADC circuits can be lower than other approaches.

Using various techniques of this disclosure, a capacitor array of a digital-to-analog converter (DAC) circuit of a first stage of a pipelined ADC circuit or a SAR ADC circuit can include bit-trial capacitors and corresponding respective reservoir capacitors. During a conversion phase, a control circuit can control transfer of a charge from a reservoir capacitor to set one of the bit-trial capacitors based on a comparator decision. Then, the control circuit can couple a reference voltage to the previously set bit-trial capacitor to transfer another charge, e.g., prior to generating a residue voltage in a pipelined ADC circuit, where the reference voltage is more accurate than the voltage of the reservoir capacitor.

By using the techniques of this disclosure, the reservoir capacitors can supply most of the charge to the bit-trial capacitors as the bit-trials are performed. The accurate reference voltage source, e.g., an "external" reference buffer circuit, only needs to supply the difference, e.g., an inaccuracy, in the charge supplied by the reservoir capacitors. Instead of having to resettle for each bit-trial, the accurate reference voltage source has only to deliver the initial charge to the reservoir capacitors during acquisition and once more when the ADC circuit is ready to sample onto the residue amplifier. That is, the accurate reference voltage source has only to deliver charge twice rather than for every bit trial. And, during the second deliver of charge, the accurate reference voltage source has only to deliver a small percentage of the total charge. These techniques can ease the demands on the reference buffer circuit and requirement of external decoupling capacitors, for example.

In addition, by using the techniques of this disclosure, gain/offset drift errors and/or integral nonlinearity (INL) errors that can occur in some reservoir capacitor based ADC circuits can be reduced. In some example implementations, high-drift, low-area reservoir capacitors can be used making the techniques area efficient. For example, the reservoir capacitors can be positioned below the bit-trial capacitors.

FIG. 1 is a simplified schematic diagram of an example of a pipelined ADC circuit. The pipelined ADC circuit 20 can include at least a first stage 22 and a second stage 24. The first stage can include a first ADC circuit 26 configured to generate an N-bit digital output that represents an analog input signal Vin.

The N-bit output of the first ADC circuit can be coupled to an N-bit digital-to-analog converter (DAC) circuit 28 of a second ADC circuit of the first stage. In some examples, the DAC circuit 28 can be a capacitor DAC and can include an array of capacitors $C_N$-$C_0$, e.g., binary weighted capacitors, that can each be coupled to receive the input voltage Vin, and can be coupled to either a positive reference voltage Vrefp or a negative reference voltage Vrefm. As depicted in FIG. 1, the top plates of the capacitors $C_N$-$C_0$ can be coupled to a bias voltage ("$V_{CM}$") via top plate switch 30 and the bottom plates of the capacitors $C_N$-$C_0$ can be coupled to analog input voltage Vin using switches $S_N$-$S_0$, or to a positive reference voltage Vrefp or a negative reference voltage Vrefm using various other switches shown.

In this disclosure, the terms "top plates" and "bottom plates" are used for convenience in describing the figures and are not meant to imply that there is any required spatial orientation for the capacitors. Further, the switches referred to in this disclosure can include transistors and, in particular, complementary metal-oxide-semiconductor (CMOS) transistors due to their high performance and yield.

A common terminal 32 of the DAC circuit 28 can be coupled via switch 34 to a residue amplifier circuit 36 (also referred to in this disclosure as an "amplifier circuit"). Using a feedback capacitor 38, the output 40 of the amplifier circuit 36 can be coupled to the inverting input of the amplifier circuit 36. The output 40 of the amplifier circuit 36 can be coupled to another ADC circuit 42, e.g., of the second stage 24, having one or more capacitors 44, e.g., a capacitor DAC circuit.

In operation, when a control circuit 46 closes switch 48, the first ADC circuit 26 can receive the analog input signal Vin. When the control circuit 46 closes the top plate switch 30 and closes switches $S_N$-$S_0$, the capacitors $C_N$-$C_0$ of the DAC circuit 28 can also receive the analog input signal Vin. The first ADC circuit 26 samples the input and at the same time switch 30 opens, the DAC circuit 28 samples Vin across capacitors $C_N$-$C_0$.

Optionally, in some example configurations, after sampling, the control circuit 46 can generate and apply a random or pseudo-random dither code to control one or more of switches 50 coupled to the dither DAC circuit 52. Using the dither code, each capacitor $d_0$ through $d_{N-2}$ of the dither DAC 52 can be coupled to a positive reference voltage Vrefp or a negative reference voltage Vrefn.

Then, the first ADC circuit 26 can perform a conversion on the sampled Vin. An output voltage of the DAC circuit 28 can be compared to the sampled voltage, such as using the comparator circuit 45. The comparator circuit 45 can determine whether the output of the DAC circuit 28 is greater than or less than the sampled input voltage Vin, and the result of the comparison can be stored as a one or zero for that bit of the DAC. Based on the output of the comparator circuit 45, the control circuit 46 can couple the switches $S_N$-$S_0$ to positive reference voltage Vrefp or negative reference voltage Vrefn to correspond to a bit value. The conversion then proceeds to the next bit value until all bits of the first ADC circuit 26 are determined. One iteration of comparing the voltage to the input voltage and changing the DAC accordingly can be referred to as a bit trial or a bit determination.

The control circuit 46 can load the N-bit output of the first ADC circuit 26 onto the DAC circuit 28 by controlling various switches of DAC circuit 28 to disconnect Vin and couple voltage references Vrefp or Vrefm to the bottom plates of the capacitors $C_N$-$C_0$ based on the K-bit output of the first ADC circuit, which can represent the most significant bits (MSBs).

The pipelined ADC circuit 20 can include a coarse ADC circuit 27. The coarse ADC circuit 27 can quickly determine K bits, e.g., the first several MSBs, and load the K bit-trials onto the first ADC circuit by controlling various switches $S_N$-$S_0$. The first ADC circuit 26 can perform additional bit-trials to resolve the remaining (N-K) bit-trials, after loading the K bit trials from the coarse ADC 27.

When the first ADC circuit 26 has completed its bit-trials, a "residue" charge results that is the difference between the N-bit approximation of the charge of the analog input signal Vin produced by the first ADC 26 and the actual charge of the analog input signal Vin that was sampled on the capacitors $C_N$-$C_0$ of the DAC circuit 28.

The control circuit 46 can close switch 34 to transfer the residue charge on the common terminal 32 to an ADC circuit 42 of the second stage 24, which can sample the residue charge. Prior to the transfer, the residue charge can be amplified using the amplifier circuit 36. The ADC circuit 42 of the second stage can perform an analog-to-digital conversion on the sampled residue to determine the remaining bits (for a 2-stage pipelined ADC) or a portion of the remaining bits (for a pipelined ADC with more than 2 stages). In some example configurations, the second stage 24 can determine the least significant bits (LSBs) from the residue.

To generate the overall digital output, the control circuit 46 can also control switching to load the N-bit output of the first stage, representing the first group of bits of the overall digital output, and an M-bit output of the second stage, representing the second group of bits of the overall digital output, into an encoder (not depicted) to generate a digital output representing the analog input signal Vin.

As described below, gain drift errors and/or integral nonlinearity (INL) errors that can occur in some reservoir capacitor based ADC circuits can be reduced even when using high-drift, low-area reservoir capacitors, in accordance with various techniques of this disclosure. In addition, sequence dependent errors can be reduced. Using various techniques of this disclosure, a capacitor array of a DAC circuit, e.g., of a SAR ADC circuit or a first stage of a pipelined ADC circuit, can include a plurality of bit-trial capacitors and a plurality of reservoir capacitors associated with respective bit-trial capacitors. A control circuit can control a transfer of a charge from a reservoir capacitor to set one of the bit-trial capacitors based on a comparator decision during a conversion phase. Then, the control circuit can couple a reference voltage to the previously set bit-trial capacitor to transfer another charge, e.g., prior to generating a residue voltage for a pipelined ADC circuit, where the reference voltage is more accurate than the voltage of the reservoir capacitor.

Figure 2:
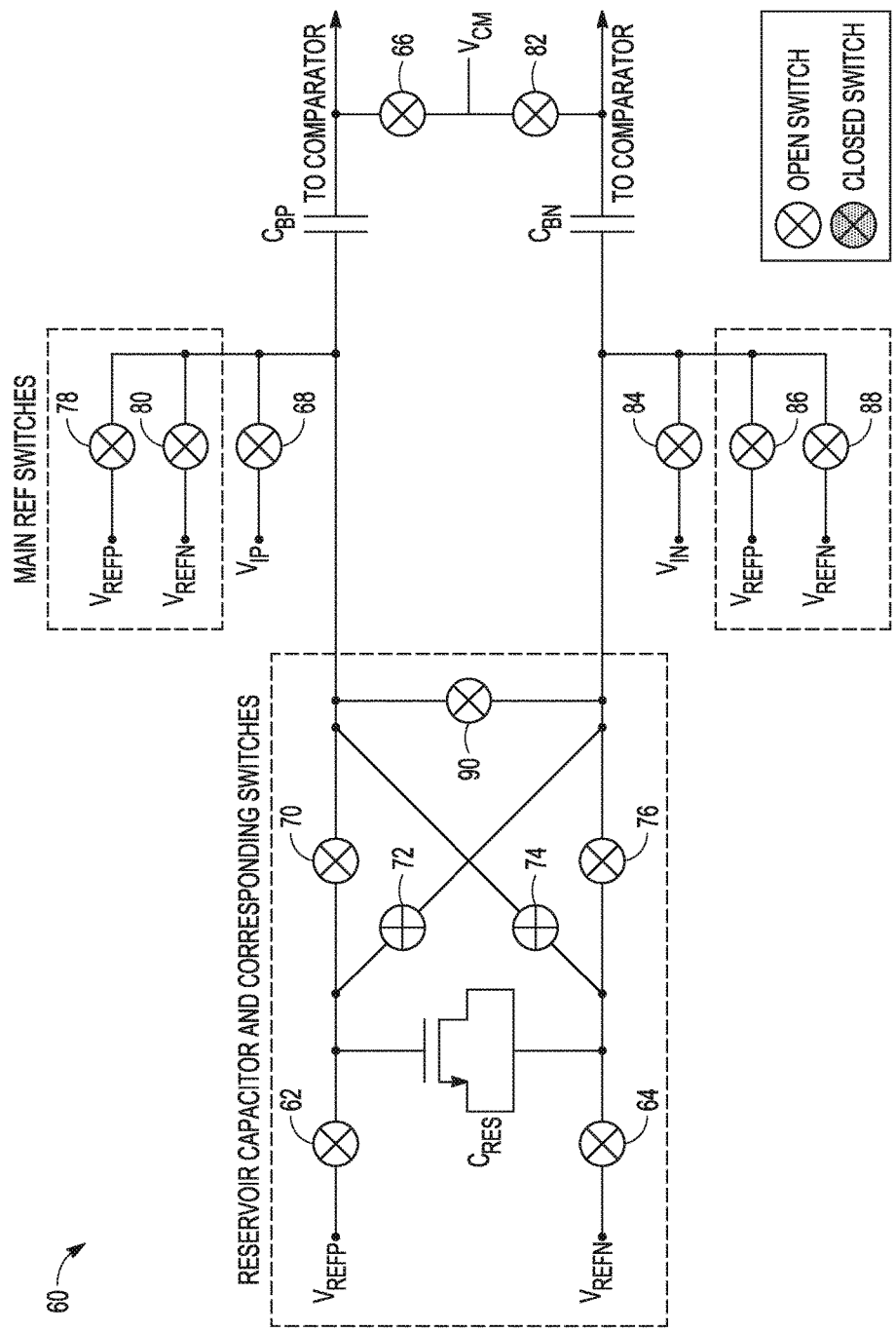
FIG. 2 is a schematic diagram of an example of a unit element of a capacitor array in an ADC circuit that can be used to implement various techniques of this disclosure.

FIG. 2 is a schematic diagram of an example of a unit element 60 of a capacitor array in an ADC circuit that can be used to implement various techniques of this disclosure. Although the unit element 60 in FIG. 2 is shown in a differential configuration, single-ended configurations can also be used. Each of the switches shown in FIG. 2 and elsewhere in this disclosure can be implemented using transistors, for example.

The unit element 60, which forms part of a capacitor array, e.g., of a DAC circuit, can include a reservoir capacitor $C_{RES}$. The reservoir capacitor $C_{RES}$ can be coupled to main reference voltage sources $V_{REFP}$ (positive) and $V_{REFN}$ (negative) using switches 62, 64 and charged. The unit element 60 can also include a bit-trial capacitor $C_{BP}$ of the capacitor array, e.g., a weighted bit-trial capacitor, having a top plate that can be coupled to a bias voltage, e.g., ground or a common mode voltage $V_{CM}$ via a switch 66. The top plate of bit-trial capacitor $C_{BP}$ can also be coupled to a comparator, e.g., of ADC1 of FIG. 5 (not depicted) or comparator 504 of FIG. 8.

A bottom plate of the bit-trial capacitor $C_{BP}$ can be coupled via a switch 68 to an analog input voltage signal $V_{IP}$. In accordance with this disclosure, the bottom plate of the bit-trial capacitor $C_{BP}$ can be coupled first to the reservoir capacitor $C_{RES}$ via one or more of switches 70-76 to transfer a first charge to set the bit-trial capacitor, and then coupled to the accurate main reference voltage sources $V_{REFP}$ or $V_{REFN}$ using switches 78, 80 to transfer a second charge.

As mentioned above, the example unit element 60 in FIG. 2 is shown in a differential configuration. As such, the unit element 60 can include a second bit-trial capacitor $C_{BN}$ having a top plate that can be coupled via a switch 82 to the bias voltage, and a bottom plate that can be coupled to an analog input voltage signal $V_{IN}$ via a switch 84, to the reservoir capacitor $C_{RES}$ via one or more of switches 70-76, and to the main reference voltage sources $V_{REFP}$ and $V_{REFN}$ using switches 86, 88.

In some examples, the unit element 60 can be part of a capacitor array of a first ADC circuit of a first stage of a pipelined ADC circuit. In other examples, the capacitor array can be a part of a SAR ADC circuit. Operation of the unit element 60 during sampling and conversion phases is shown and described below with respect to FIGS. 3A-3F. A control circuit can control operation of the switches in FIGS. 3A-3F, such as the control circuit 204 of pipelined ADC circuit 200 of FIG. 5 or the control circuit 506 of SAR ADC circuit 500 of FIG. 8.

Figure 3A:
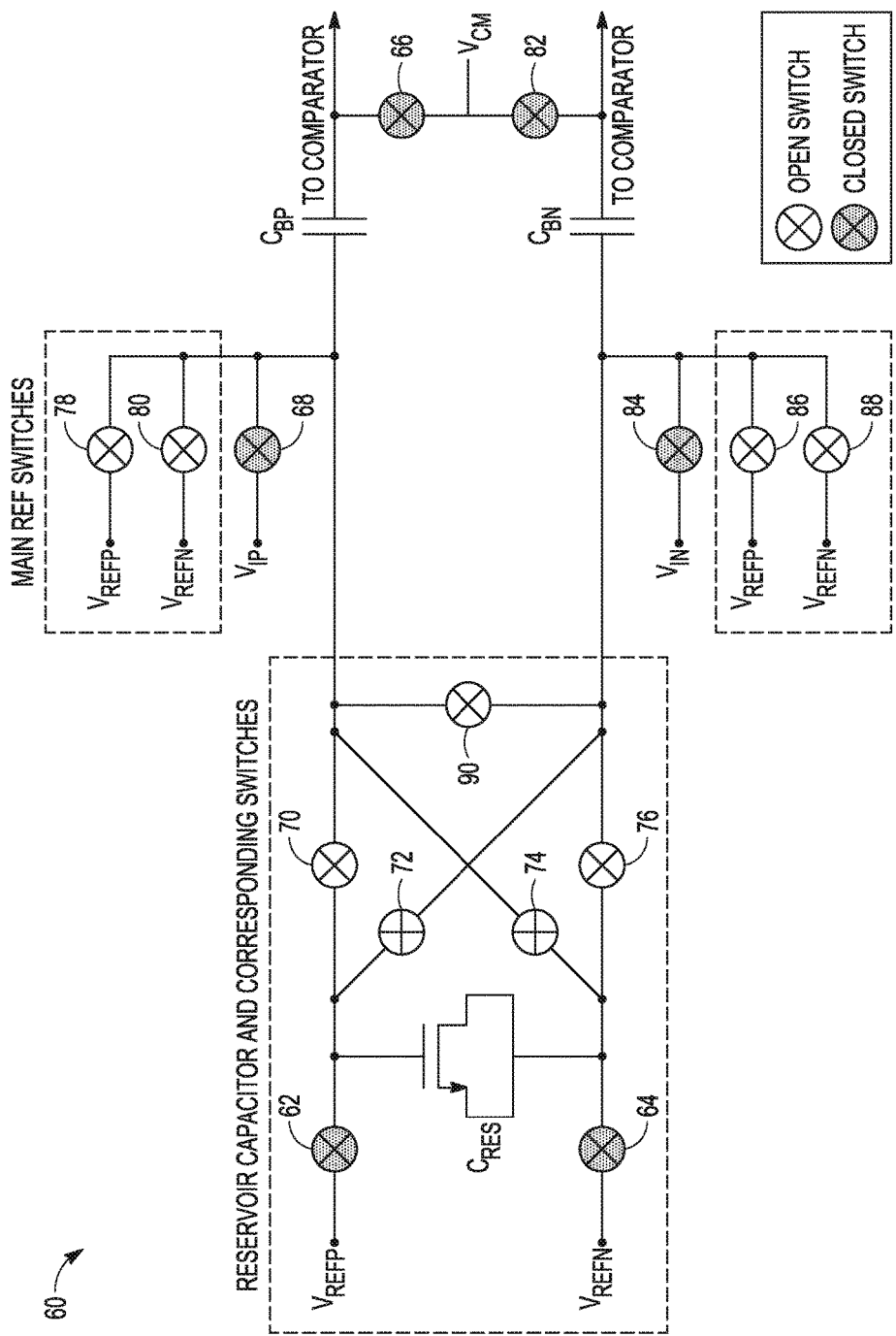
FIG. 3A is a schematic diagram of the unit element of FIG. 2 in a sampling phase.

FIG. 3A is a schematic diagram of the unit element 60 of FIG. 2 in a sampling phase. During a sampling phase, the top plate switches 66, 82 can be closed to couple the top plates of bit-trial capacitors $C_{BP}$ and $C_{BN}$ to the bias voltage, e.g., shown as common mode voltage $V_{CM}$. In addition, switches 68, 84 can be closed to couple the bottom plates of bit-trial capacitors $C_{BP}$ and $C_{BN}$ to analog input signal $V_{IP}$ and $V_{IN}$, respectively. Also during the sampling phase, the reservoir capacitor $C_{RES}$ can be coupled to the main reference voltage sources $V_{REFP}$ and $V_{REFN}$ using switches 62, 64 and charged.

Figure 3B:
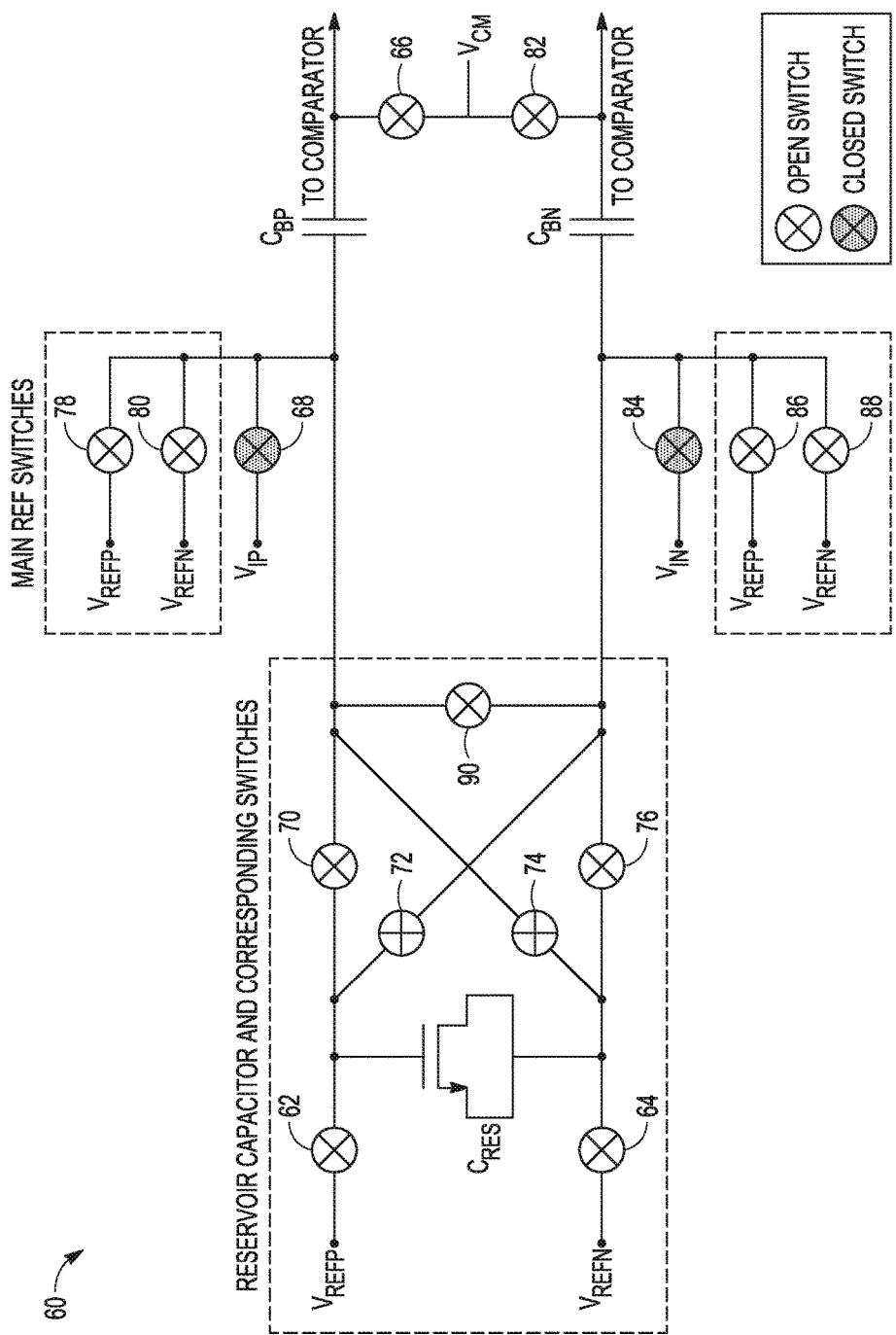
FIG. 3B is a schematic diagram of the unit element of FIG. 3A with the top plate switches opened.

FIG. 3B is a schematic diagram of the unit element 60 of FIG. 3A with the top plate switches opened. As seen in FIG. 3B, the top plate switches 66, 82 have opened, which freezes the charge on the bit-trial capacitors $C_{BP}$ and $C_{BN}$. In addition, the switches 62, 64 that couple the reservoir capacitor $C_{RES}$ to the main reference voltage sources $V_{REFP}$ and $V_{REFN}$ are opened.

Next, a conversion phase can begin after the switches 68, 84 open and decouple the bottom plates of bit-trial capacitors $C_{BP}$ and $C_{BN}$ from analog input signal $V_{IP}$ and $V_{IN}$, respectively. Optionally, prior to begin the bit-trials, switch 90 can be closed to short the bottom plates of the bit-trial capacitors $C_{BP}$ and $C_{BN}$.

Figure 5:
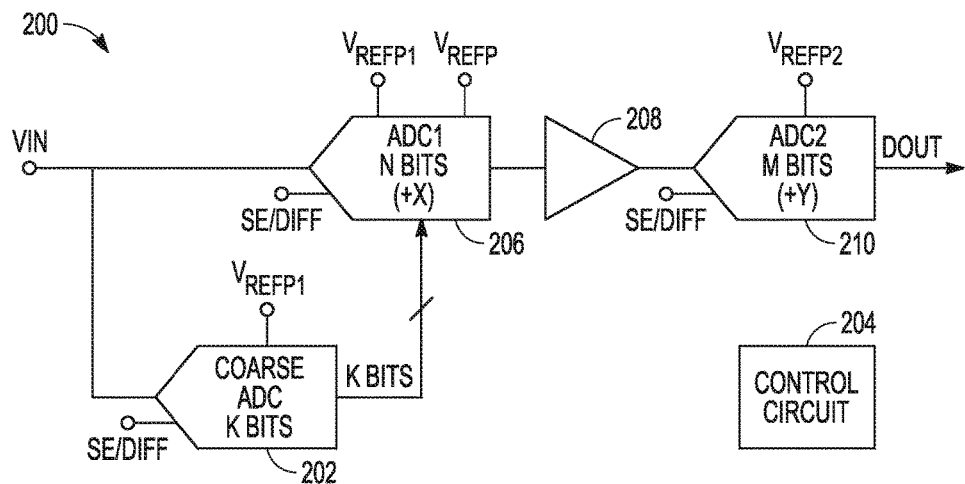
FIG. 5 is a simplified schematic diagram of an example of a pipelined ADC circuit that can implement various techniques of this disclosure.
Figure 8:
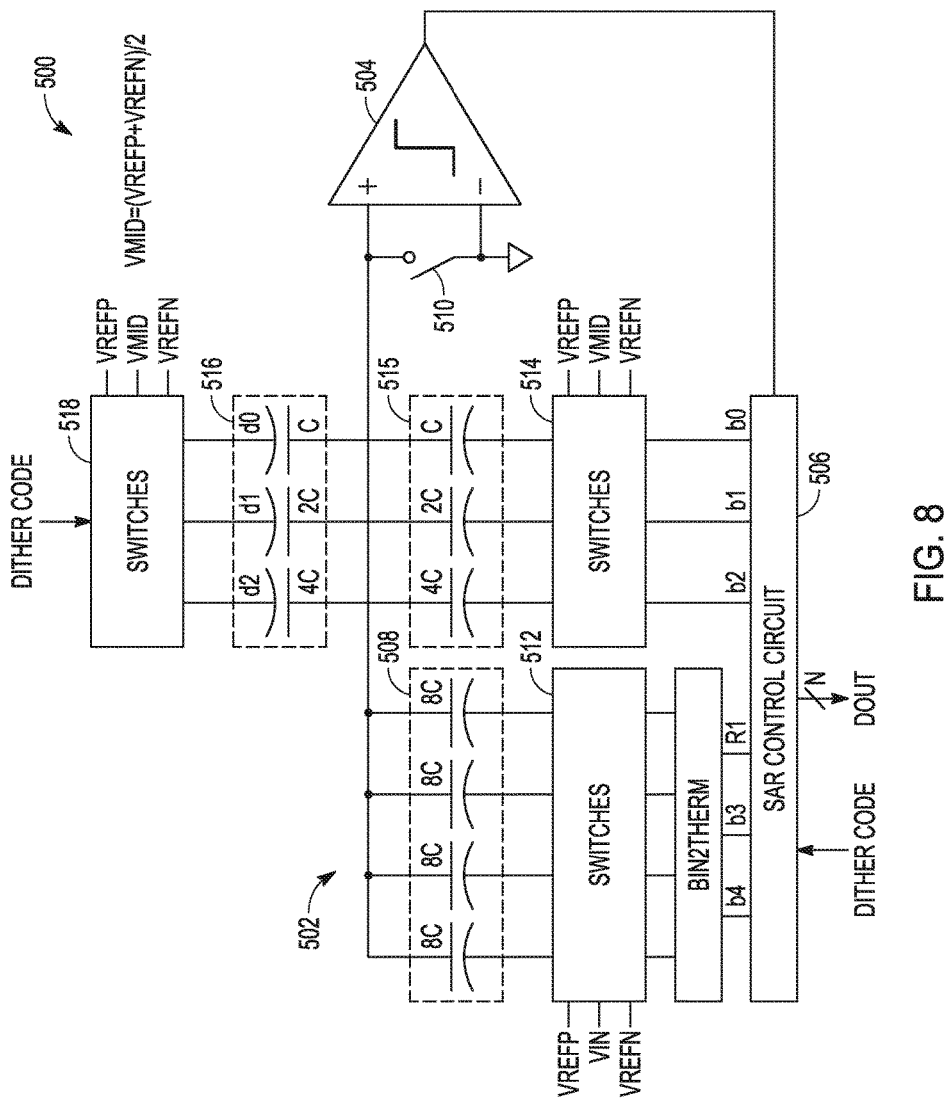
FIG. 8 is a schematic diagram of an example of an analog-to-digital converter circuit.

During the conversion phase, each of the unit elements 60 of the capacitor array, e.g., of ADC1 of FIG. 5 or DAC circuit 502 of FIG. 8, can be coupled to the input(s) of a comparator and bit-trials can be performed (charge balancing a reference charge stored on the bit-trial capacitors against a sampled charge).

Figure 3C:
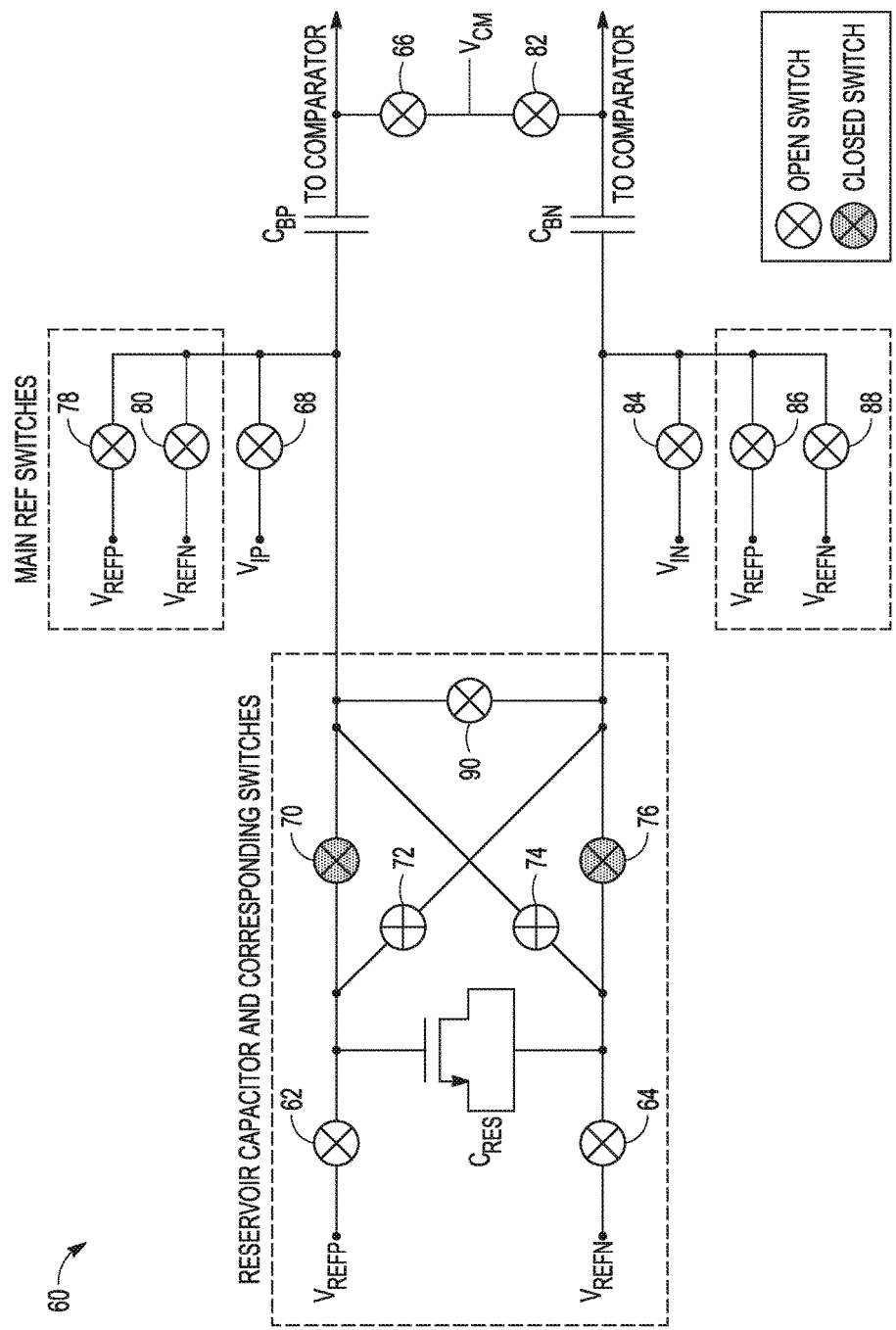
FIG. 3C is a schematic diagram of the unit element of FIG. 3B loading a comparator result of "1" onto the bit-trial capacitors.
Figure 3D:
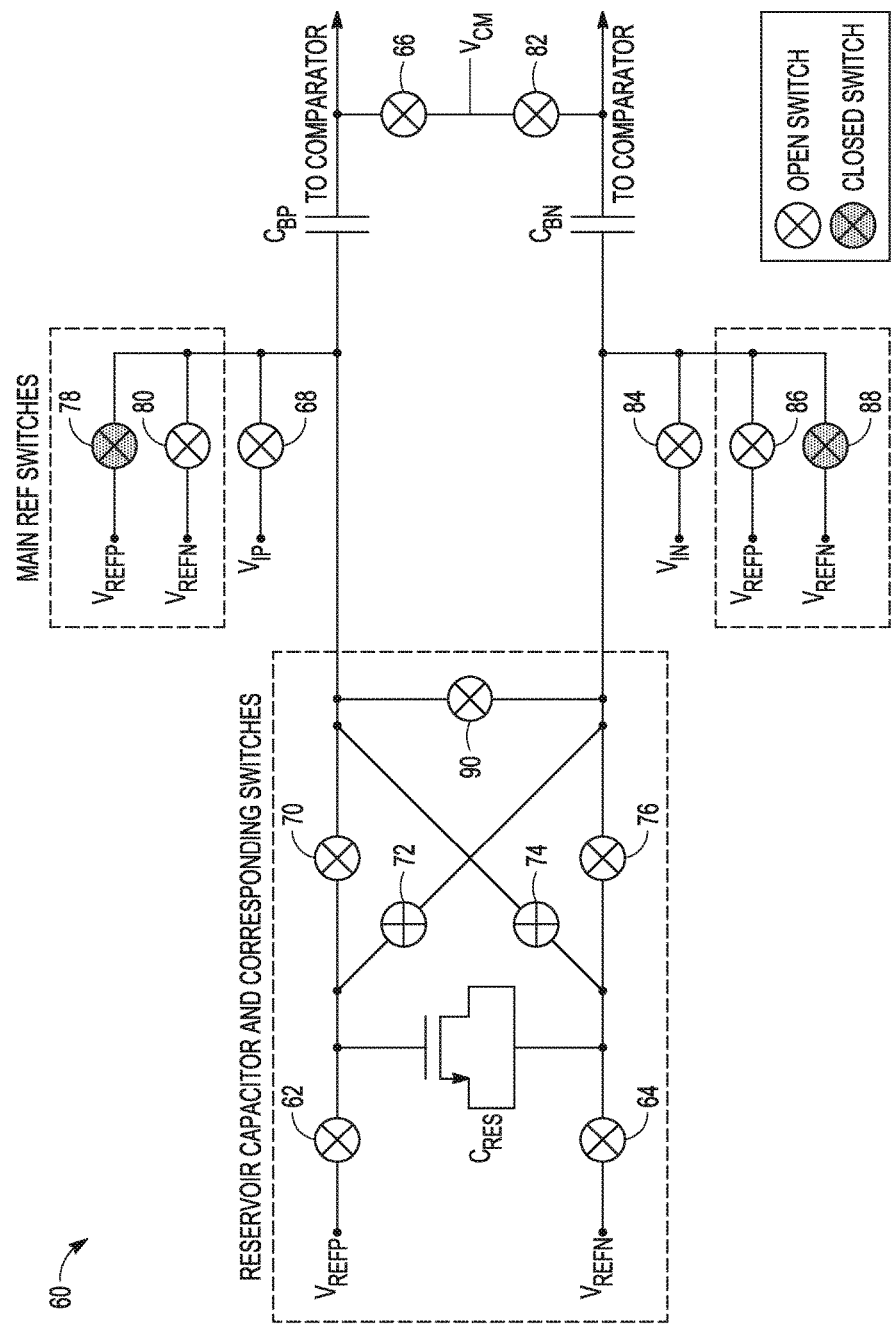
FIG. 3D is a schematic diagram of the unit element of FIG. 3C coupling a bit-trial capacitor to an accurate voltage reference.

FIG. 3C is a schematic diagram of the unit element 60 of FIG. 3B loading a comparator result of "1" onto the bit-trial capacitors. Using various techniques of this disclosure, a control circuit can close switches 70, 76 to control a transfer of a first charge from the reservoir capacitor $C_{RES}$ to set a bit-trial capacitor(s) of the capacitor array, e.g., bit-trial capacitors $C_{BP}$ and $C_{BN}$. In FIG. 3D, the previously set bit-trial capacitors can be coupled to the accurate reference voltage to transfer a second charge.

FIG. 3D is a schematic diagram of the unit element 60 of FIG. 3C coupling a bit-trial capacitor to an accurate voltage reference. The previously set bit-trial capacitors $C_{BP}$ and $C_{BN}$, which were set to "1" in the example shown in FIG. 3C, can be coupled to the accurate reference voltage to transfer a second charge. In particular, a control circuit can close switches 78, 88 to couple main reference voltages $V_{REFP}$ and $V_{REFN}$ to the previously set bit-trial capacitors $C_{BP}$ and $C_{BN}$, respectively.

Figure 3E:
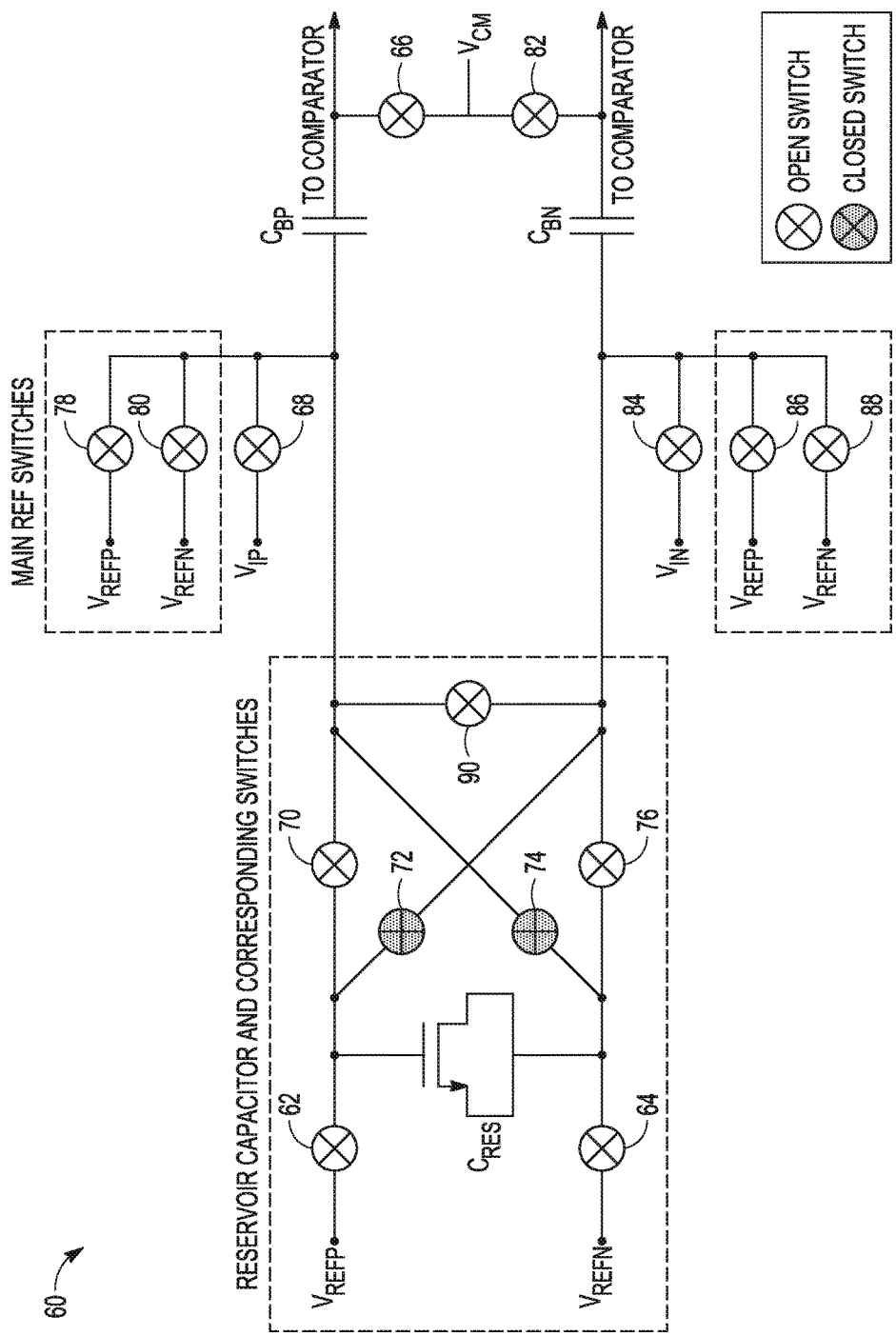
FIG. 3E is a schematic diagram of the unit element of FIG. 3B loading a comparator result of "0" onto the bit-trial capacitors.
Figure 3F:
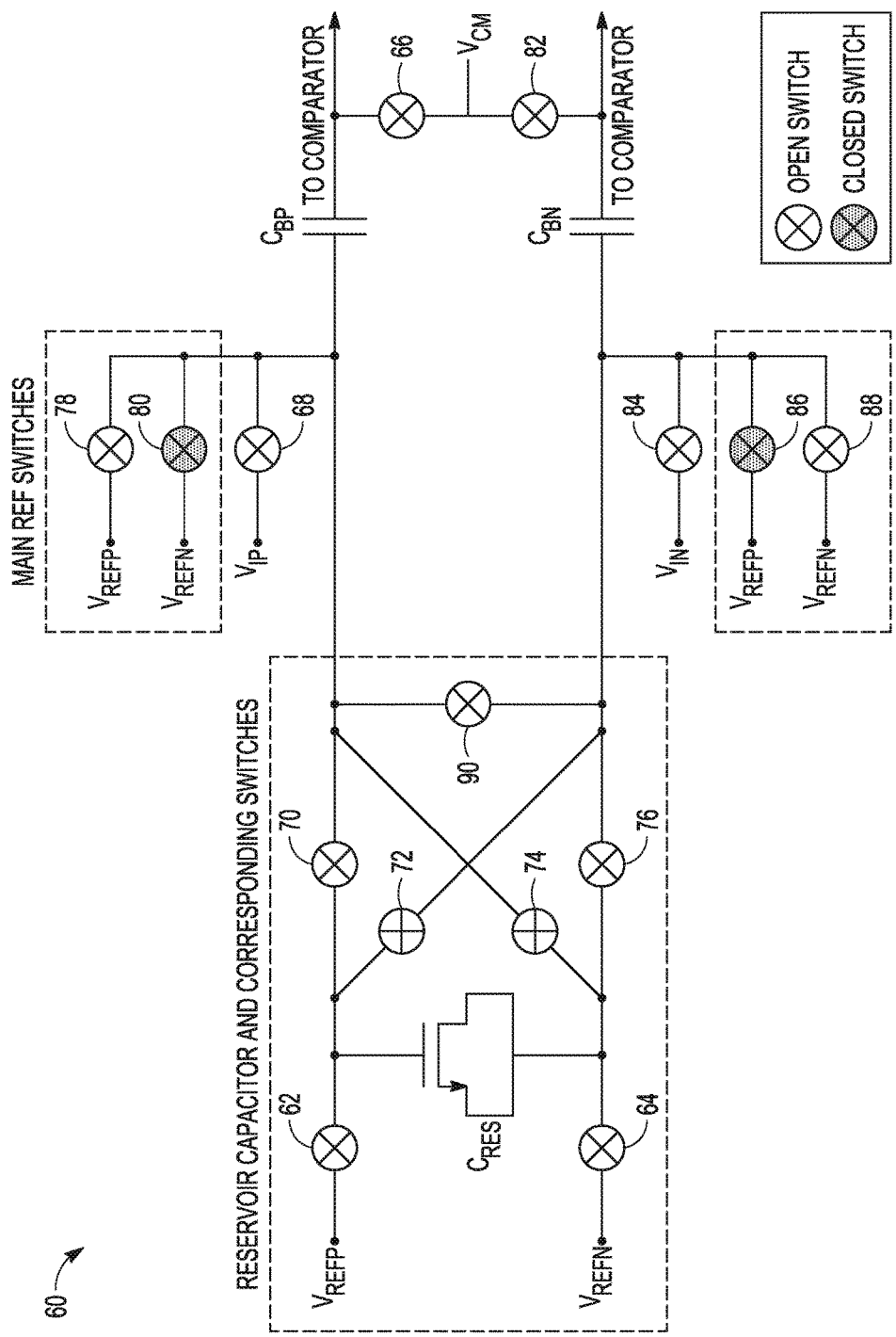
FIG. 3F is a schematic diagram of the unit element of FIG. 3E coupling a bit-trial capacitor to an accurate voltage reference.

FIG. 3E is a schematic diagram of the unit element 60 of FIG. 3B loading a comparator result of "0" onto the bit-trial capacitors. A control circuit can close switches 72, 74 to cross-couple the reservoir capacitor $C_{RES}$ to the bit-trial capacitors $C_{BP}$ and $C_{BN}$ to control a transfer of a first charge from the reservoir capacitor $C_{RES}$ to set the bit-trial capacitors. In FIG. 3F, the previously set bit-trial capacitors can be coupled to the accurate reference voltage to transfer a second charge.

FIG. 3F is a schematic diagram of the unit element 60 of FIG. 3E coupling a bit-trial capacitor to an accurate voltage reference. The previously set bit-trial capacitors $C_{BP}$ and $C_{BN}$, which were set to "0" in the example shown in FIG. 3E, can be coupled to the accurate reference voltage to transfer a second charge. In particular, a control circuit can close switches 80, 86 to couple the main reference voltages $V_{REFN}$ and $V_{REFP}$ to the previously set bit-trial capacitors $C_{BP}$ and $C_{BN}$, respectively.

Figure 4A:
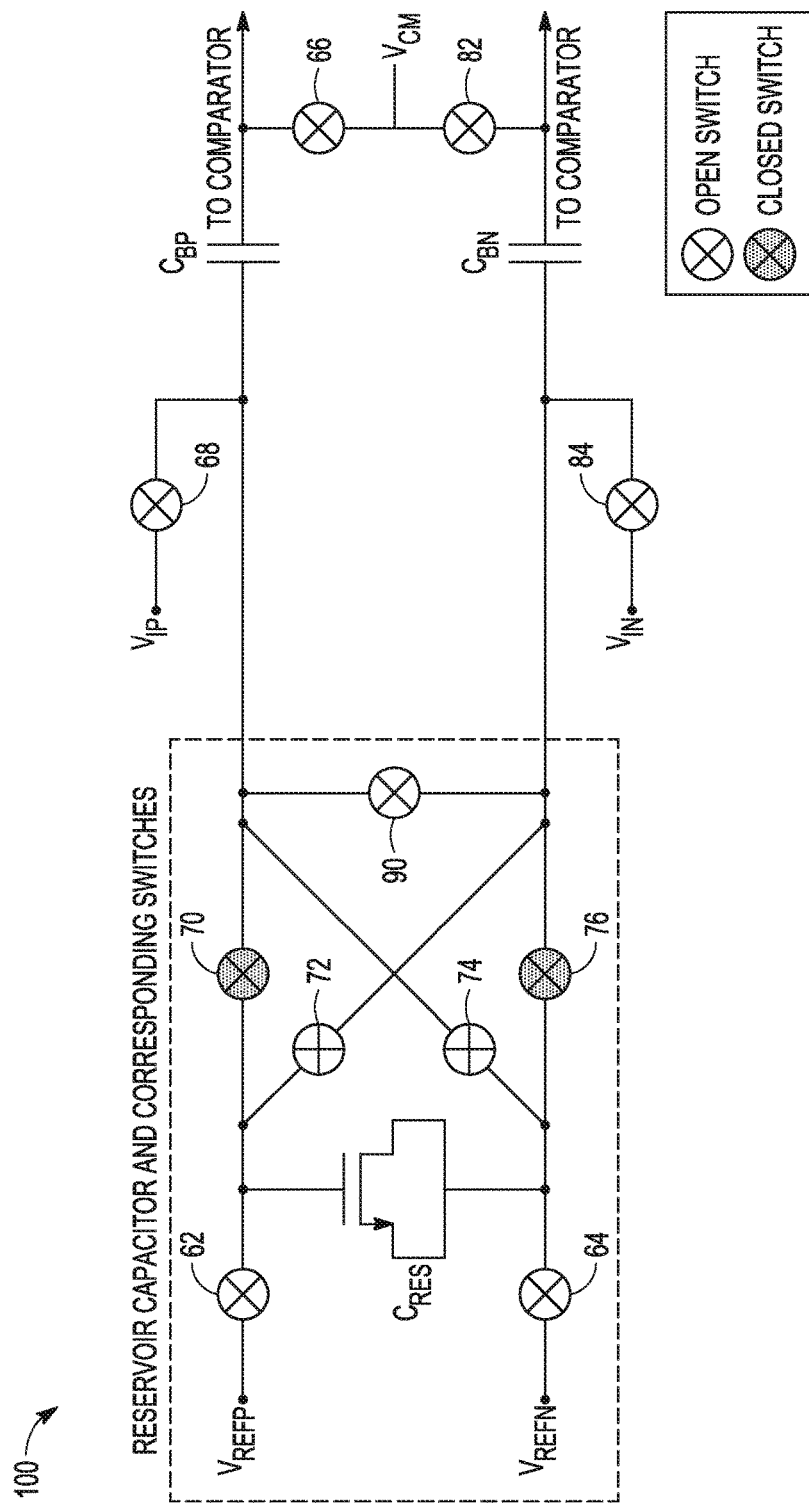
FIG. 4A is a schematic diagram of another example of a unit element of a capacitor array in an ADC circuit that can be used to implement various techniques of this disclosure.

FIG. 4A is a schematic diagram of another example of a unit element 100 of a capacitor array in an ADC circuit that can be used to implement various techniques of this disclosure. In contrast to the unit element 60 shown in FIG. 2, the unit element 100 of FIG. 4 does not include the switches 78, 80, 86, and 88 of FIG. 2 to directly couple the bottom plates of the bit-trial capacitors $C_{BP}$ and $C_{BN}$ to the main reference voltage sources $V_{REFP}$ and $V_{REFN}$.

A control circuit, e.g., control circuit 204 of FIG. 5 or control circuit 506 of FIG. 8, can control a transfer of a first charge from the reservoir capacitor $C_{RES}$ to set the bit-trial capacitors $C_{BP}$ and $C_{BN}$, as described above. In FIG. 4A, the control circuit has closed switches 70, 76 to load a comparator result of "1" onto the bit-trial capacitors $C_{BP}$ and $C_{BN}$.

Figure 4B:
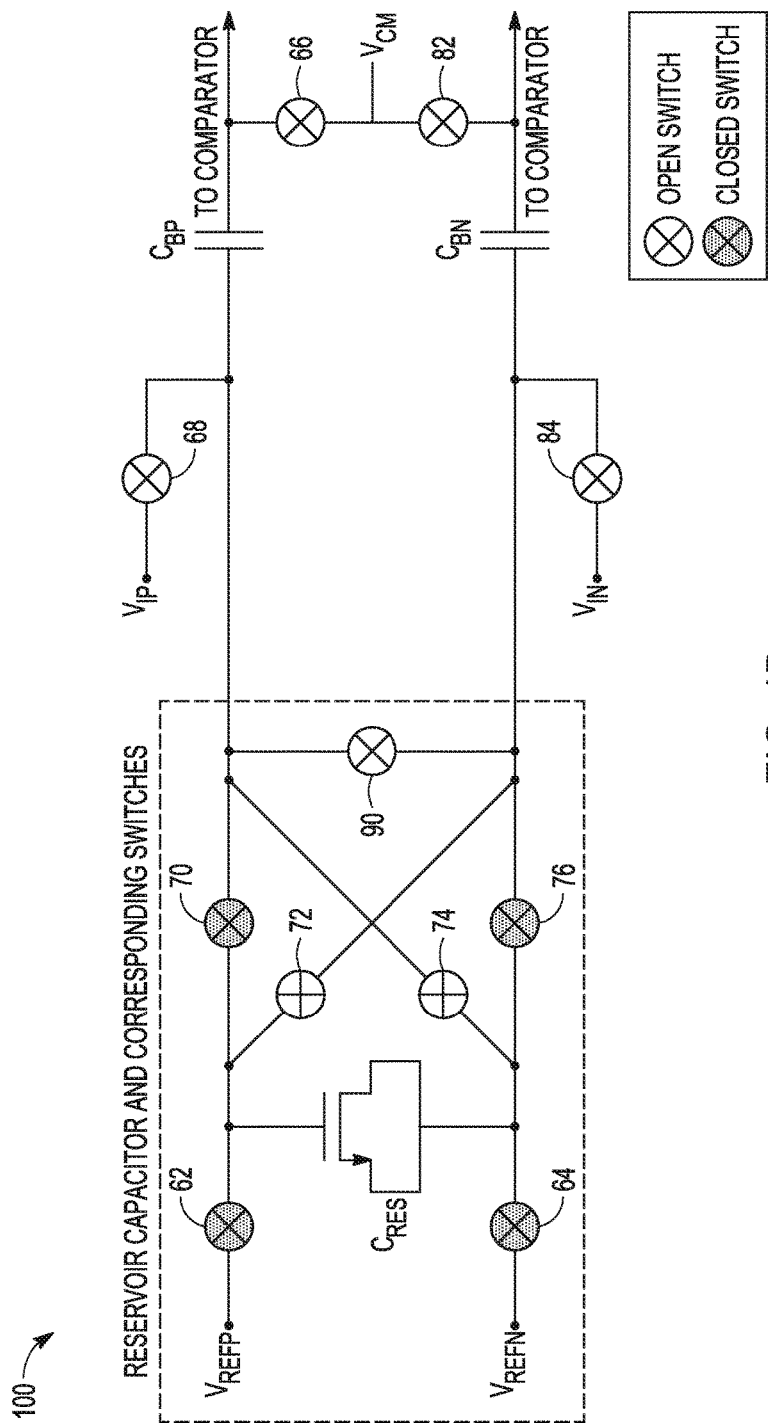
FIG. 4B is a schematic diagram of the unit element of FIG. 4B coupling a bit-trial capacitor to an accurate voltage reference.

FIG. 4B is a schematic diagram of the unit element 100 of FIG. 4B coupling a bit-trial capacitor to an accurate voltage reference. The previously set bit-trial capacitors $C_{BP}$ and $C_{BN}$, which were set to "1" in the example shown in FIG. 4A, can be coupled to the accurate reference voltage to transfer a second charge. In particular, a control circuit can keep switches 70, 76 closed and then close switches 62, 64 to couple the accurate main reference voltages $V_{REFP}$ and $V_{REFN}$ to the previously set bit-trial capacitors $C_{BP}$ and $C_{BN}$, respectively.

The unit elements and the techniques shown and described above in FIGS. 2-4B can be used in various ADC topologies, including pipelined ADC circuits and SAR ADC circuits. An example of a pipelined ADC that can implement various techniques of this disclosure is shown in FIG. 5 and an example of a SAR ADC that can implement various techniques of this disclosure is shown in FIG. 8.

FIG. 5 is a simplified schematic diagram of an example of a pipelined ADC circuit that can implement various techniques of this disclosure. The pipelined ADC circuit 200 of FIG. 5 can include components similar to those described above with respect to FIG. 1 and, for purposes of conciseness, will not be described in detail again.

Figure 6A:
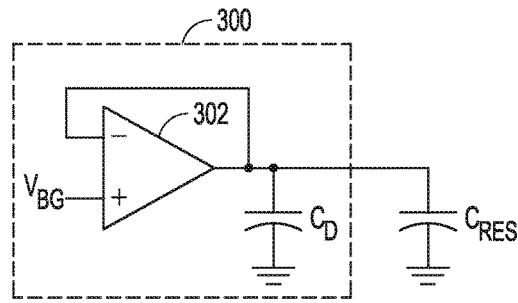
FIG. 6A is a schematic diagram of an example of a voltage reference buffer circuit that can be an accurate voltage reference source coupled to a reservoir capacitor.

The coarse ADC circuit 202 can be a K-bit ADC. The control circuit 204 can couple an analog input signal Vin onto both the coarse ADC circuit 202 and a capacitor array of an N-bit ADC circuit 206 ("ADC1" in FIG. 5) of a first stage of the pipelined ADC circuit 200. The N-bit ADC circuit 206 can include and use unit elements having reservoir capacitors similar to those described above, e.g., unit element 60 in FIG. 2 or unit element 100 in FIG. 4A. Voltages "Vrefp1" and "Vrefp2" represent reference voltages generated using the reservoir capacitors and voltage "Vrefp" represents an accurate reference voltage, e.g., voltage "Vrefp" in FIG. 2, that was generated by an output of a reference buffer, e.g., as shown in FIG. 6A.

The coarse ADC circuit 202 can quickly determine K bits, e.g., the first several MSBs. In some example implementations, the coarse ADC circuit 202 can include and use unit elements having reservoir capacitors similar to those described above, e.g., unit element 60 in FIG. 2 or unit element 100 in FIG. 4A, and can optionally use the same type of capacitors for both reservoir capacitors and bit-trial capacitors. The control circuit 204 can load the results of the coarse ADC 202 onto the DAC circuit of ADC1, e.g., similar to DAC circuit 28 of FIG. 1

In some examples, the coarse ADC circuit 202 can provide a coarse resolution and thus be low power. Provided that the remaining circuitry has sufficient range, any errors that result from the noisy coarse ADC circuit 202 can be corrected. Further, a coarse ADC can help convert higher input voltage ranges using a low voltage supply and can allow the ADC to power down comparator circuit 208 during the acquisition phase and provide auto zeroing during the coarse ADC conversion. In some examples, the coarse ADC circuit 202 can be a flash ADC. In other examples, the coarse ADC circuit 202 can include a SAR topology.

It should be noted that the coarse ADC circuit 202 is not limited to use with a pipelined ADC circuit, such as shown in FIG. 5. Rather, the coarse ADC circuit 202 can be implemented with other ADC circuit topologies, such as a SAR ADC circuit, e.g., SAR ADC circuit 500 of FIG. 8.

By utilizing the coarse ADC circuit 202, the K bits can be quickly determined and then the results can be loaded simultaneously onto ADC1 206 in FIG. 5, for example. The simultaneous loading of the results, in contrast to sequentially determining the results using ADC1 alone, can reduce any non-linearity errors induced by using reservoir capacitors.

Using the techniques of this disclosure, ADC1 206 can perform bit-trials using corresponding respective reservoir capacitors to determine the remaining (N-K) bits, e.g., reservoir capacitor $C_{RES}$ in FIG. 2. To set a bit-trial capacitor of ADC1 206, e.g., capacitor $C_{bp}$ of FIG. 2, the control circuit 204 can control switches to transfer a first charge from a reservoir capacitor, e.g., capacitor $C_{RES}$ of FIG. 2, to the corresponding respective bit-trial capacitor. Then, before generating a residue voltage using ADC1 206, the control circuit 204 can control switches, e.g., switches 78, 80, 86, and 88 of FIG. 2, to couple an accurate reference voltage to the previously set bit-trial capacitor to transfer a second charge.

By using the techniques of this disclosure, the reservoir capacitors can supply most of the charge to the bit-trial capacitors as the bit-trials are performed. The accurate reference voltage source, e.g., an "external" or "internal" reference buffer circuit, only needs to supply the difference, e.g., an inaccuracy, in the charge supplied by the reservoir capacitors. Instead of having to resettle for each bit-trial, the accurate reference voltage source has only to deliver the initial charge to the reservoir capacitors during acquisition and once more when ADC1 206 is ready to sample onto the residue amplifier. That is, the accurate reference voltage source has only to deliver charge twice rather than for every bit trial. And, during the second deliver of charge, the accurate reference voltage source has only to deliver a small percentage of the total charge. These techniques can ease the demands on the reference buffer circuit and any external decoupling capacitors, for example.

Further, these techniques can allow use of a high-drift, low-area metal-oxide-semiconductor (MOS) capacitors as reservoir capacitors. Any gain and/or offset drift that can result from the use of the MOS capacitors will be corrected because the control circuit can couple to the bit-trial capacitors to the accurate reference voltage prior to generating the residue voltage. Further, the proposed techniques can use die area efficiently because the reservoir capacitors can be positioned "below" the bit-trial capacitors.

In some example implementations, ADC1 206 can include one or more ("X") additional redundant capacitors. Because of the redundancy in ADC1 206, small errors are allowed to be made in the bit-trial decisions through much of the conversion process, which can speed up the conversion. After switching to the accurate reference voltage, the control circuit can perform one or more bit-trials using the redundant capacitors to help correct for or recover from any errors that may occur during the bit-trial process. With the techniques of this disclosure, there is only a need for high accuracy prior to generating the residue voltage, so lower accuracy is permitted while performing the bit-trials.

Once the control circuit 206 has coupled the accurate reference voltage to the previously set bit-trial capacitor to transfer a second charge, the residue charge can be amplified by a residue amplifier circuit 208. The control circuit 204 can control a transfer of the residue charge to an M-bit ADC circuit 210 ("ADC2" in FIG. 5) of the second stage, which can sample the residue charge. The M-bit ADC circuit 210 can include and use unit elements having reservoir capacitors similar to those described above, e.g., unit element 60 in FIG. 2 or unit element 100 in FIG. 4A.

In some example configurations, the reservoir capacitors can be metal-oxide-semiconductor (MOS) capacitors, metal-insulator-metal (MIM) capacitors, or metal-oxide-metal (MOM) capacitors. In another example configuration, the reservoir capacitors of ADC1 can include metal-oxide-semiconductor (MOS) capacitors, and the reservoir capacitors of ADC2 can be different from the reservoir capacitors of ADC1, such as metal-insulator-metal (MIM) capacitors or metal-oxide-metal (MOM) capacitors.

ADC2 can perform an analog-to-digital conversion on the sampled residue to determine the remaining M bits (for a 2-stage pipelined ADC) or a portion of the remaining bits (for a pipelined ADC with more than 2 stages). In some example configurations, the second stage can determine the least significant bits (LSBs) from the residue. In some example implementations, the M-bit ADC circuit 210 can include one or more ("Y") additional redundant capacitors that can help correct for or recover from any errors that may occur during the bit-trial process.

Gain errors can occur during the conversion process based on the capacitance of a reservoir capacitor and the capacitance of a corresponding bit-trial capacitor, where the gain error is a function of a ratio of their capacitances ($C_{RES}/C_{BIT-TRIAL}$). To reduce or correct a gain error between the reference voltage and a voltage of the reservoir capacitor, ADC1 of FIG. 5 can optionally include a gain correction DAC circuit. An example of a gain correction DAC is the dither DAC 52 shown in FIG. 1, where the dither DAC 52 can be reused or repurposed as a gain correction DAC. In some example implementations, the gain correction DAC can use reservoir capacitors.

Using the known capacitances of each reservoir capacitor and corresponding bit-trial capacitor, the control circuit 204 can calculate a gain error for every possible input value. Then, prior to the residue amplifier sampling the charge, the control circuit can apply a gain error code representing the gain error to the switches coupled to the gain correction DAC, e.g., switches 50 of FIG. 1. Using the gain error code, one or more of the gain correction capacitors, e.g., capacitors $d_{N-2}$ through $d_0$ of FIG. 1, can be coupled to the DAC circuit, e.g., to the common terminal 32 of the DAC circuit 28 of FIG. 1, thereby applying a small additional charge to the charge that the control circuit determined was associated with the input signal.

As shown in FIG. 5, the coarse ADC circuit 202, the ADC1 circuit 206, and the ADC2 circuit 210 can be connected in a single-ended ("SE") or differential ("DIFF") configuration. In a single-ended configuration, the second input (labeled "SE/DIFF") of the coarse ADC circuit 202, the second input (labeled "SE/DIFF") of the ADC1 circuit 206, and the second input (labeled "SE/DIFF") of the ADC2 circuit 210 can be coupled to a bias voltage, e.g., ground or a common mode voltage. In a differential configuration, additional DAC circuits can be used and coupled differentially to the second inputs of the coarse ADC circuit 202, the ADC1 circuit 206, and the ADC2 circuit 210. An example of a differential configuration is depicted in U.S. Pat. No. 7,432,844 to Mueck et al.

In the non-limiting specific example configuration of FIG. 5, the coarse ADC circuit can be a 5-bit ADC, ADC1 can be a 9-bit ADC circuit with 2 redundant bits, and ADC2 can be a 9-bit ADC circuit with 3 redundant bits. In some example configurations, one or both of ADC1. and ADC2 of the pipelined ADC can include a successive approximation register (SAR) topology. SAR ADC operation is known to those of ordinary skill in the art. An example SAR ADC circuit is described below with respect to FIG. 8.

FIG. 6A is a schematic diagram of an example of a voltage reference buffer circuit 300 that can be an accurate voltage reference source coupled to a reservoir capacitor. The voltage reference buffer circuit 300 (or "reference buffer 300") can include an operational amplifier (op-amp) 302 having a positive input terminal configured to receive a precision reference voltage Vbg, e.g., a bandgap reference voltage, and a negative input terminal connected to an output of the op-amp 302 in a feedback configuration. The output of the op-amp 302 can be coupled to a decoupling capacitor Cd and to a reservoir capacitor $C_{RES}$, e.g., reservoir capacitor $C_{RES}$ of FIG. 2, and can provide the accurate reference voltage, e.g., Vrefp or Vrefn of FIG. 2.

During an acquisition phase, the reference buffer 300 replenishes charge on the reservoir capacitor $C_{RES}$, which can overlap with the input signal acquisition. It should be noted that the settling need not be fully accurate.

Figure 6B:
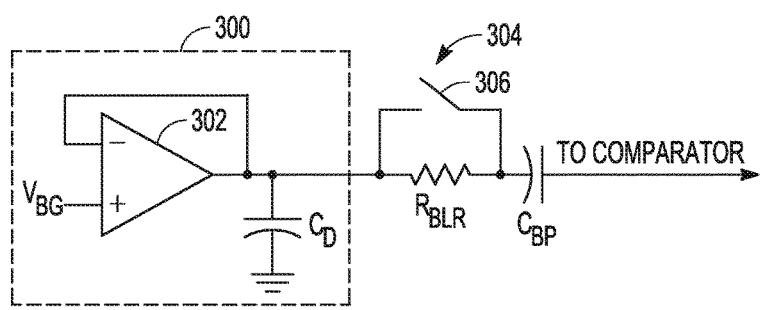
FIG. 6B is a schematic diagram of the voltage reference buffer circuit of FIG. 6A coupled to a bit-trial capacitor.

FIG. 6B is a schematic diagram of the voltage reference buffer circuit 300 of FIG. 6A coupled to a bit-trial capacitor. The voltage reference buffer circuit 300 can be coupled to a bit-trial capacitor Cbp, e.g., of ADC1 206 of FIG. 5.

During a residue amplification phase, the reference buffer 300 can charge the bottom plates of the bit-trial capacitors Cbp, e.g., of ADC1 206 of FIG. 5. As indicated above, the reference buffer 300 need only to supply the difference in the charge supplied by the reservoir capacitors.

Optionally, the reference buffer 300 of the ADC circuit can be coupled to a bit-trial capacitor Cbp via a dynamic filter 304. In the example shown in FIG. 6B, the dynamic filter 304 can include a bypass switch 306 and a band-limiting resistive component $R_{BLR}$. To reduce the noise sampled onto the bit-trial capacitor Cbp, the resistive component $R_{BLR}$ can initially be bypassed when switch 306 is closed, which can allow a voltage to quickly settle onto the $R_{BLR}$. Once the voltage has settled, the control circuit, e.g., the control circuit 204 of FIG. 5, can open switch 306 thereby placing the resistive component $R_{BLR}$ in series with the resistive component $R_{BLR}$, which can band limit the noise.

Figure 7:
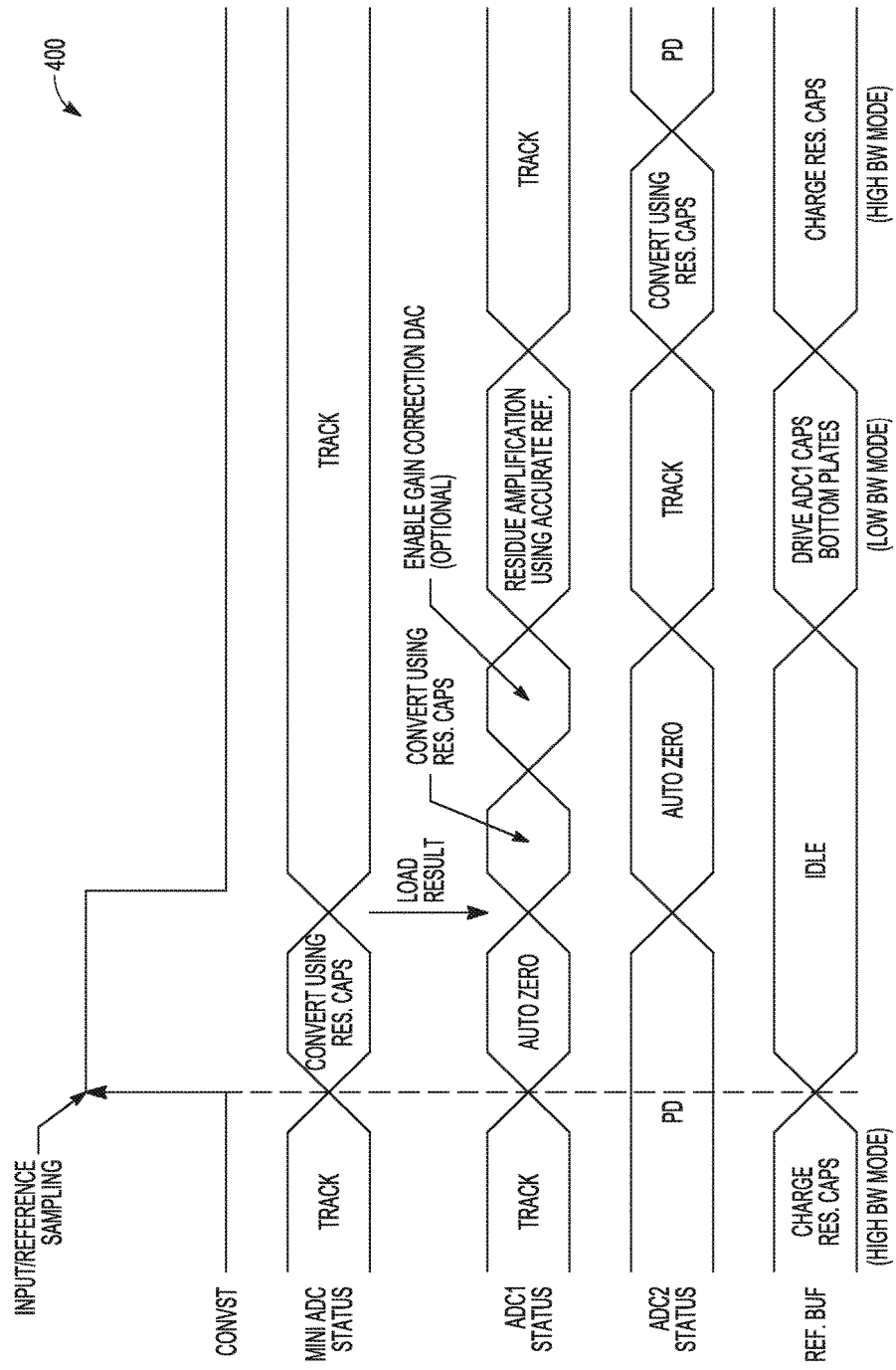
FIG. 7 is an example of a timing diagram of a pipelined ADC circuit implementing various techniques of this disclosure.

FIG. 7 is an example of a timing diagram 400 of a pipelined ADC circuit implementing various techniques of this disclosure. For example, the timing diagram can represent the timing of the pipelined ADC 200 of FIG. 5.

Initially, when the convert start signal ("Convst") is low, the coarse ADC circuit, e.g., the coarse ADC circuit 202 of FIG. 5, and ADC1, e.g., ADC1 of FIG. 5, can be in a track mode, as indicated by their respective statuses in FIG. 7. In addition, the ADC2 circuit, e.g., ADC2 of FIG. 5, can be in a powered down mode ("PD") and the reference buffer, e.g., voltage reference buffer circuit 300 of FIG. 6A, can be charging the reservoir capacitors, e.g., in a high bandwidth mode.

Then, when the convert start ("Convst") signal goes high, the analog input signal, e.g., Vin in FIG. 5, can be sampled and the coarse ADC circuit can convert several MSB bits using its reservoir capacitors, for example. While the coarse ADC circuit is performing its conversion, ADC1 can auto-zero and the reference buffer can be idle.

Following the conversion of several MSB bits, the conversion results of the coarse ADC circuit can be loaded onto ADC1 and the coarse ADC can enter the track mode. When the convert start ("Convst") signal goes low, ADC1 can begin its conversion process using its reservoir capacitors to set the bit-trial capacitors, thereby transferring a first charge.

Meanwhile, ADC2 can auto-zero and, optionally, a gain correction DAC of ADC1 can correct any gain errors, as described above.

Following any optional gain correction, the bit-trial capacitors of ADC1 can be coupled to the accurate reference buffer circuit, which can drive the bottom plates of the previously set bit-trial capacitors, e.g., in a low bandwidth mode, thereby transferring a second charge. A residue amplifier, e.g., residue amplifier of FIG. 5, can amplify the residue of ADC1 while ADC2 enters a track mode.

While the reference buffer circuit is re-charging the reservoir capacitors, e.g., in a high bandwidth mode, ADC1 can enter its track mode and ADC2 can begin a conversion using its reservoir capacitors. Following its conversion phase, the pipelined ADC circuit can generate a digital output, e.g., Dout of FIG. 5, and. ADC2 can enter a powered down mode. The circuit is ready for the next convert start ("Convst") signal.

Although the techniques of this disclosure were described above with respect to a pipelined ADC circuit, the techniques are applicable to other ADC topologies, including SAR ADC circuits, for example. An example of a SAR ADC that can implement various techniques of this disclosure is shown in FIG. 8.

FIG. 8 is a schematic diagram of an example of an analog-to-digital converter circuit. The analog-to-digital converter (ADC) circuit 500 of FIG. 8 is a successive approximation register (SAR) ADC, the operation of which being known to those of ordinary skill in the art. The SAR ADC circuit 500 can include a digital-to-analog converter (DAC) circuit 502, e.g., a switched capacitor array, a comparator circuit 504, and SAR logic control and computation circuitry 506.

The SAR logic control circuitry 506 can control the DAC operation, such as during the bit trials (charge balancing a reference charge stored on the bit trial capacitors against a sampled charge). The SAR logic control and computation circuitry 506 initiates a sample of an input voltage, initiates the first conversion of the sampled input voltage to a first set of bit values, such as using a first set of bit trials, and initiates a second conversion of a second sampled input voltage to a second set of bit values, such as using a second set of bit trials, and so forth.

The SAR logic control and computation circuitry 506 can include a state machine or other digital engine to perform functions such as progressing the ADC through different states of operation and to perform the calculations described. The SAR logic control and computation circuitry 506 can determine a final N-bit digital output value for the sampled input, and the final N-bit digital value can be made available as a digital output Dout. In some configurations that use dither, such as shown in FIG. 8, the SAR logic control and computation circuitry 506 can receive the dither code as an input to allow it to compute the digital output Dout.

The DAC circuit 502 shown in FIG. 8 is a switched capacitor DAC that includes an array of capacitors. The DAC circuit 502 can include at least N weighted circuit components, such as where the weight (e.g., capacitance value) of a particular weighted circuit component can be specified relative to that of one or more other weighted circuit components, with N being a positive integer. In certain examples, N is equal to sixteen and the weighted circuit components include sixteen capacitors (for example, with the sixteen capacitors including different multiples of a specified unit capacitor to obtain the weighting relative to each other).

A portion of the DAC circuit 102 can be a sampling DAC circuit 508. During a sampling phase, the SAR logic control circuitry 506 can control operation of a top plate sampling switch 510, e.g., coupling the top plate switch 510 to ground or a common mode voltage, and control switches 512 to sample an analog input voltage Vin onto the bottom plates of the capacitors in the sampling DAC 108.

In some example implementations, during sampling, only the capacitors in the sampling DAC 108 sample the input signal Vin that was applied at an input of the ADC circuit 500. For example, only the capacitors representing the most significant bits (MSBs) sample the input signal Vin. All other capacitors shown, including the capacitors 515 representing the least significant bits (LSBs) can be non-sampling capacitors and the SAR logic control circuitry 106 can couple the switches 514, 518 as needed to set these non-sampling capacitors to a midscale voltage Vmid.

In other example implementations, capacitors in addition to the capacitors in the sampling DAC 108 can sample the input signal Vin. For example, one or more capacitors of a dither DAC circuit 516 can sample the input voltage Vin. In some example implementations, the midscale voltage Vmid can be equal to (Vrefp+Vrefn)/2, where Vrefp is a positive reference voltage and Vrefn is a negative reference voltage. The sample is considered to have been taken when SAR logic control circuitry 106 opens the top plate switch 510.

In addition to a sampling DAC 108, the ADC circuit 500 can include a dither DAC circuit 516. The performance of the ADC circuit 500 can be improved by deliberately introducing noise (or "dither"). The introduction of a random or pseudo-random dither signal, can improve the performance of the ADC circuit. The introduction of dither can allow the SAR logic control circuitry 106 to find different capacitor DAC codes for the same input signal, then this can be used to provide an improvement in the fine integral nonlinearity (INL) of the ADC. The amount of dither added is generally subtracted from the final digital word.

After sampling, the SAR logic control circuitry 106 can generate and apply a random or pseudo-random dither code to control one or more of switches 518 coupled to the dither DAC circuit 516. Using the dither code, each capacitor of the dither DAC 516 can be coupled to positive reference voltage Vrefp or negative reference voltage Vrefn. The SAR conversion process can begin after the dither code has been applied. In the non-limiting example configuration of FIG. 8, bits b4 (16 units), b3 (8 units), redundant bit r1 (8 units), b2 (4 units), b1 (2 units) and b0 (1 unit) are determined by the SAR conversion process.

A conversion may start with the DAC circuit 102 set to midscale, for example. An output voltage of the DAC circuit 102 can be compared to the sampled voltage, such as using the comparator circuit 104. The comparator 104 can determine whether the output of the DAC circuit 102 is greater than or less than the sampled input voltage Vin, and the result of the comparison can be stored as a one or zero for that bit of the DAC.

Using the techniques described above, each of the capacitors in the sampling DAC 108, each of the capacitors 515, and (optionally) the dither DAC capacitors can be associated with a corresponding reservoir capacitor, such as shown in FIG. 2 and FIG. 4A. Based on the output of the comparator circuit 104, the SAR logic control circuitry 106 can couple the switches 512 (and switches 514, when needed for the LSBs) to positive reference voltage Vrefp or negative reference voltage Vrefn to set the bit-trial capacitor to a bit value, where Vrefp and Vrefn are first associated with a corresponding reservoir capacitor to transfer a first charge to the bit-trial capacitor. Then, as described above, the SAR logic control circuitry 106 can couple the switches 512 (and switches 514, when needed for the LSBs) to positive reference voltage Vrefp or negative reference voltage Vrefn to transfer a second charge to the previously set bit-trial capacitor, where Vrefp and Vrefn are associated with an accurate reference voltage source, e.g., reference buffer 300 of FIG. 6A.

Optionally, the dither DAC 516 can be reused or repurposed as a gain correction DAC to compensate for any gain errors, as described above.

The conversion then proceeds to the next bit value until all bits of the digital value are determined. One iteration of comparing the voltage to the input voltage and changing the DAC accordingly can be referred to as a bit trial or a bit determination. Before testing, bits b2-b0 may be at 1 or 0. These bits may be set for testing. They then may be kept or rejected depending on a comparator decision.

By using various techniques described above, gain/offset drift errors and/or integral nonlinearity (INL) errors that can occur in some reservoir capacitor based ADC circuits can be reduced even using high-drift, low-area reservoir capacitors.

Figure 9:
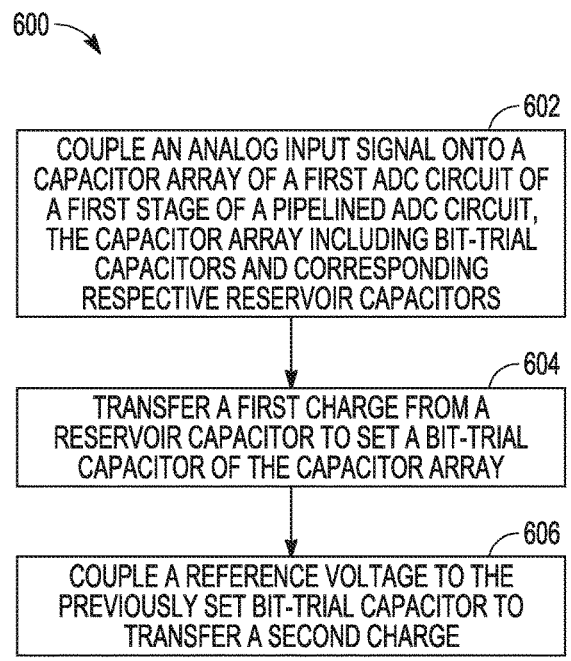
FIG. 9 is a flow diagram of an example of a method of operating an ADC circuit using various techniques of this disclosure.

FIG. 9 is a flow diagram of an example of a method 600 of operating an ADC circuit using various techniques of this disclosure. At block 602, the method 600 can include coupling an analog input signal onto a capacitor array of a first ADC circuit of the SAR ADC circuit, the capacitor array including bit-trial capacitors and corresponding respective reservoir capacitors. For example, the control circuit 204 of the pipelined ADC circuit 200 of FIG. 5 can control various switches, e.g., switches in FIG. 2, to couple analog signal Vin onto a capacitor array of ADC1 in FIG. 5, which can include bit-trial capacitors and reservoir capacitors as shown in FIG. 2.

As another example, the control circuit 506 of the SAR ADC circuit 500 of FIG. 8 can control various switches, e.g., switches in FIG. 2, to couple analog signal Vin onto the capacitor array 502 in FIG. 8, which can include bit-trial capacitors and reservoir capacitors as shown in FIG. 2.

At block 604, the method 600 can include transferring a first charge from a reservoir capacitor to set a bit-trial capacitor of the capacitor array. For example, the control circuit 204 of the pipelined ADC circuit 200 of FIG. 5 can control various switches, e.g., switches in FIG. 2, to close and transfer a first charge from a reservoir capacitor $C_{RES}$ to a bit-trial capacitor Cbp, such as in FIG. 2.

As another example, to perform a SAR bit-trial, the control circuit 506 of the SAR ADC circuit 500 of FIG. 8 can control various switches, e.g., switches in FIG. 2, to close and transfer a first charge from a reservoir capacitor $C_{RES}$ to a bit-trial capacitor Cbp, such as in FIG. 2.

At block 606, the method can include coupling a reference voltage to the previously set bit-trial capacitor to transfer a second charge. For example, before generating a residue voltage using the first ADC circuit, the control circuit 204 of the pipelined ADC circuit 200 of FIG. 5 can control various switches, e.g., switches in FIG. 2, to close and transfer a second charge from a reference voltage, e.g., from a reference voltage buffer circuit such as in FIG. 6A, to the previously set bit-trial capacitor Cbp, such as in FIG. 2.

For example, the control circuit 506 of the SAR ADC circuit 500 of FIG. 8 can control various switches, e.g., switches in FIG. 2 or FIG. 4A, to close and transfer a second charge from a reference voltage, e.g., from a reference voltage buffer circuit such as in FIG. 6A, to the previously set bit-trial capacitor Cbp, such as in FIG. 2 or FIG. 4A.

Optionally, the method 600 can further include performing a bit-trial using at least one redundant bit-trial capacitor after coupling the reference voltage to the previously set bit-trial capacitor.

Optionally, an ADC circuit implementing various techniques of this disclosure can include a coarse ADC circuit, such as the coarse ADC circuit 202 of FIG. 5 or the coarse ADC circuit 202 implemented with SAR. ADC circuit 500 of FIG. 8. As such, the method 600 can further include, before a conversion phase, coupling the analog input signal onto a coarse ADC circuit, performing at least one bit-trial using the coarse ADC circuit, and loading an output of the coarse ADC circuit onto at least one of the bit-trial capacitors of the first ADC circuit.

Optionally, an ADC circuit implementing various techniques of this disclosure can include a gain correction DAC, such as gain correction DAC circuit 52 of FIG. 1 in a pipelined ADC circuit, or a gain correction DAC circuit 516 of a SAR ADC.

Optionally, an ADC circuit implementing various techniques of this disclosure can include a dynamic filter to dynamically alter a configuration of a reference buffer, e.g., reference buffer circuit 300 of FIG. 6B, of a pipelined ADC circuit or a SAR ADC circuit to improve at least one of a noise and settling characteristic.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method for operating a pipelined analog-to-digital (ADC) circuit, the method comprising:
    coupling an analog input signal onto a capacitor array of a first ADC circuit of a first stage of the pipelined ADC circuit, the capacitor array including bit-trial capacitors and corresponding respective reservoir capacitors;
    transferring a first charge from a reservoir capacitor to set a bit-trial capacitor of the capacitor array; and
    before generating a residue voltage using the first ADC circuit, coupling a reference voltage to the previously set bit-trial capacitor to transfer a second charge.

2. The method of claim 1, wherein the bit-trial capacitors include at least one redundant bit-trial capacitor, the method further comprising:
    after coupling the reference voltage to the previously set bit-trial capacitor, performing a bit-trial using the at least one redundant bit-trial capacitor.

3. The method of claim 1, further comprising:
    before a conversion phase using the first ADC circuit:
        coupling the analog input signal onto a coarse ADC circuit of the first stage of the pipelined ADC circuit;
        performing at least one bit-trial using the coarse ADC circuit; and loading an output of the coarse ADC circuit onto at least one of the bit-trial capacitors of the first ADC circuit.

4. The method of claim 1, further comprising:
performing a gain correction to reduce or correct a gain error between the reference voltage and a voltage of the reservoir capacitor.

5. The method of claim 1, further comprising:
dynamically altering a configuration of a reference buffer of the pipelined ADC circuit to improve at least one of a noise and settling characteristic.

6. The method of claim 5, wherein altering the configuration includes:
during a residue amplification phase, reducing a bandwidth of the reference buffer.

7. The method of claim 1, further comprising:
generating and transferring the residue voltage onto a second capacitor array of a second ADC circuit of a second stage of the pipelined ADC circuit, wherein the second capacitor array of the second ADC circuit includes bit-trial capacitors and corresponding respective reservoir capacitors; and
transferring a third charge from a reservoir capacitor of the second ADC circuit to set a bit-trial capacitor of the second capacitor array.

8. A pipelined analog-to-digital converter (ADC) circuit comprising:
a first ADC circuit of a first stage of the pipelined ADC circuit, the first ADC circuit including a digital-to-analog converter (DAC) circuit having a capacitor array including bit-trial capacitors and corresponding respective reservoir capacitors;
a control circuit configured to control operation of a plurality of switches to:
couple an analog input signal onto the capacitor array;
transfer a first charge from a reservoir capacitor to set a bit-trial capacitor of the capacitor array; and
before generating a residue voltage using the first ADC circuit, couple a reference voltage to the previously set bit-trial capacitor to transfer a second charge.

9. The pipelined ADC circuit of claim 8, wherein the bit-trial capacitors include at least one redundant bit-trial capacitor, wherein the control circuit is further configured to control operation of the plurality of switches to:
perform a bit-trial using the at least one redundant bit-trial capacitor after coupling the reference voltage to the previously set bit-trial capacitor.

10. The pipelined ADC circuit of claim 8, further comprising:
a coarse ADC circuit having a resolution less than a resolution of the first ADC circuit,
wherein the control circuit is further configured to control operation of the plurality of switches to:
before a conversion phase using the first ADC circuit:
couple the analog input signal onto the coarse ADC circuit;
perform at least one bit-trial using the coarse ADC circuit; and
load an output of the coarse ADC circuit onto at least one of the bit-trial capacitors of the first ADC circuit.

11. The pipelined ADC circuit of claim 8, further comprising:
a gain correction DAC to reduce or correct a gain error between the reference voltage and a voltage of the reservoir capacitor.

12. The pipelined ADC circuit of claim 8, further comprising:
a reference buffer; and
a dynamic filter, wherein the control circuit configured to control operation of the plurality of switches is configured to control operation of the plurality of switches to:
filter a noise using the dynamic filter.

13. The pipelined ADC circuit of claim 8, further comprising:
a second ADC circuit in a second stage of the pipelined ADC circuit, the second ADC circuit having a second capacitor array including bit-trial capacitors and corresponding respective reservoir capacitors.

14. The pipelined ADC circuit of claim 13, wherein the reservoir capacitors of the second ADC circuit are selected from a group consisting of metal-oxide-semiconductor (MOS) capacitors, metal-insulator-metal (MIM) capacitors, and metal-oxide-metal (MOM) capacitors.

15. The pipelined ADC circuit of claim 8, wherein the reservoir capacitors of the first ADC circuit are selected from a group consisting of metal-oxide-semiconductor (MOS) capacitors, metal-insulator-metal (MIM) capacitors, and metal-oxide-metal (MOM) capacitors.

16. The pipelined ADC circuit of claim 8, wherein the analog input signal is a differential analog input signal, and wherein the pipelined ADC circuit is arranged in a differential configuration.

17. A method for operating a successive approximation register (SAR) analog-to-digital (ADC) circuit, the method comprising:
coupling an analog input signal onto a capacitor array of a first ADC circuit of the SAR ADC circuit, the capacitor array including bit-trial capacitors and corresponding respective reservoir capacitors;
performing a SAR bit-trial including:
transferring a first charge from a reservoir capacitor to set a bit-trial capacitor of the capacitor array; and
coupling a reference voltage to the previously set bit-trial capacitor to transfer a second charge.

18. The method of claim 17, wherein the bit-trial capacitors include at least one redundant bit-trial capacitor, the method further comprising:
after coupling the reference voltage to the previously set bit-trial capacitor, performing a bit-trial using the at least one redundant bit-trial capacitor.

19. The method of claim 17, further comprising:
before a conversion phase:
coupling the analog input signal onto a coarse ADC circuit;
performing at least one bit-trial using the coarse ADC circuit; and
loading an output of the coarse ADC circuit onto at least one of the bit-trial capacitors of the first ADC circuit.

20. The method of claim 17, further comprising:
performing a gain correction to reduce or correct a gain error between the reference voltage and a voltage of the reservoir capacitor.

21. The method of claim 17, further comprising:
dynamically altering a configuration of a reference buffer of the SAR ADC circuit to improve at least one of a noise and settling characteristic.

22. A successive approximation register (SAR) analog-to-digital converter (ADC) circuit comprising:
a first ADC circuit of the SAR ADC circuit, the first ADC circuit including a digital-to-analog converter (DAC) circuit having a capacitor array including bit-trial capacitors and corresponding respective reservoir capacitors;

a control circuit configured to control operation of a plurality of switches to:
couple an analog input signal onto the capacitor array;
perform a SAR bit-trial including:
transfer a first charge from a reservoir capacitor to set a bit-trial capacitor of the capacitor array; and
couple a reference voltage to the previously set bit-trial capacitor to transfer a second charge.

23. The SAR ADC circuit of claim 22, wherein the bit-trial capacitors include at least one redundant bit-trial capacitor, wherein the control circuit is further configured to control operation of the plurality of switches to:
perform a bit-trial using the at least one redundant bit-trial capacitor after coupling the reference voltage to the previously set bit-trial capacitor.

24. The SAR ADC circuit of claim 22, further comprising:
a coarse ADC circuit having a resolution less than a resolution of the first ADC circuit,
wherein the control circuit is further configured to control operation of the plurality of switches to:
before a conversion phase:
couple the analog input signal onto the coarse ADC circuit;
perform at least one bit-trial using the coarse ADC circuit; and
load an output of the coarse ADC circuit onto at least one of the bit-trial capacitors of the first ADC circuit.

* * * * *